(12) United States Patent
Huang

(10) Patent No.: US 7,800,522 B2
(45) Date of Patent: Sep. 21, 2010

(54) A/D CONVERTER AND METHOD FOR ENHANCING RESOLUTION OF DIGITAL SIGNAL

(75) Inventor: Chih-Haur Huang, Sinshih Township, Tainan County (TW)

(73) Assignee: Himax Media Solutions, Inc., Sinshih Township, Tainan County (TW)

( * ) Notice: Subject to any disclaimer, the term of this patent is extended or adjusted under 35 U.S.C. 154(b) by 6 days.

(21) Appl. No.: 12/368,593

(22) Filed: Feb. 10, 2009

(65) Prior Publication Data
US 2010/0201553 A1   Aug. 12, 2010

(51) Int. Cl.
*H03M 1/20* (2006.01)
(52) U.S. Cl. .................. 341/131; 341/143; 341/155
(58) Field of Classification Search ............ 341/131, 341/161, 155, 143, 162, 163
See application file for complete search history.

(56) References Cited

U.S. PATENT DOCUMENTS 5,880,690 A * 3/1999 Rothenberg ................ 341/161
6,486,820 B1 * 11/2002 Allworth et al. ............ 341/161

* cited by examiner

*Primary Examiner*—Jean B Jeanglaude
(74) *Attorney, Agent, or Firm*—Thomas, Kayden, Horstemeyer & Risley, LLP

(57) ABSTRACT

A method for enhancing resolution of digital signals converted from analog signals is provided. An analog input signal is converted into N-bit digital outputs, where N is a positive integer. The N-bit digital outputs are interpolated to add one or more least significant bit orders for the N-bit digital outputs. One or more dither values are generated as least significant bits corresponding to the least significant bit orders and the dither values are superimposed on the interpolation of the N-bit digital outputs. An A/D converter is also provided herein.

16 Claims, 6 Drawing Sheets

US 7,800,522 B2

A/D CONVERTER AND METHOD FOR ENHANCING RESOLUTION OF DIGITAL SIGNAL

BACKGROUND

1. Field of Invention

The present invention relates to an A/D converter. More particularly, the present invention relates to an A/D converter with high resolution.

2. Description of Related Art

Analog-to-digital converters (also called A/D converters or ADCs) are common construction blocks of electronic systems which process physical signals from transducers, electronic signal generating circuits, etc. However, conventional A/D converters usually fail to output digital signals with high resolution, thus causing the desired digital output signal outputted by the A/D converter may not be completely and well converted from an analog input signal inputted into the A/D converter. Thus, it is desired to enhance the resolution of the digital signal converted from the analog signal.

SUMMARY

In accordance with one embodiment of the present invention, an analog-to-digital converter is provided. The analog-to-digital converter comprises a plurality of stages of analog-to-digital converting (ADC) units, delay elements, a digital logic correction circuit, an interpolator and a dither generator. The ADC units serially convert an analog input signal into corresponding digital values. The delay elements synchronize the digital values from the ADC units. The digital logic correction circuit corrects offsets in the digital values from the delay elements to generate N-bit digital outputs, where N is a positive integer. The interpolator interpolates the N-bit digital outputs to add one or more least significant bit orders for the N-bit digital outputs. The dither generator generates one or more dither values corresponding to the least significant bit orders to be least significant bits and superimposed on the interpolation of the N-bit digital outputs.

In accordance with another embodiment of the present invention, a method for enhancing resolution of digital signals converted from analog signals is provided. The method includes the steps of: converting an analog input signal into N-bit digital outputs, where N is a positive integer; interpolating the N-bit digital outputs to add one or more least significant bit orders for the N-bit digital outputs; generating one or more dither values as least significant bits corresponding to the least significant bit orders; and superimposing the dither values on the interpolation of the N-bit digital outputs.

In accordance with yet another embodiment of the present invention, a method for enhancing resolution of digital signals converted from analog signals is provided. The method includes the steps of: sampling an analog input signal to obtain a sampling signal; converting the sampling signal into corresponding digital values; synchronizing the digital values; correcting offsets in the synchronized digital values to generate a plurality of digital outputs each represented by a plurality of bits; interpolating the digital outputs such that each of the digital outputs has an additional bit order; and superimposing dither values corresponding to the additional bit order on the interpolation of the digital outputs.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following description of the embodiments, with reference to the accompanying drawings as follows.

DESCRIPTION OF THE EMBODIMENTS

In the following detailed description, the embodiments of the present invention have been shown and described. As will be realized, the invention is capable of modification in various respects, all without departing from the invention. Accordingly, the drawings and description are to be regarded as illustrative in nature, and not restrictive.

Figure 1:
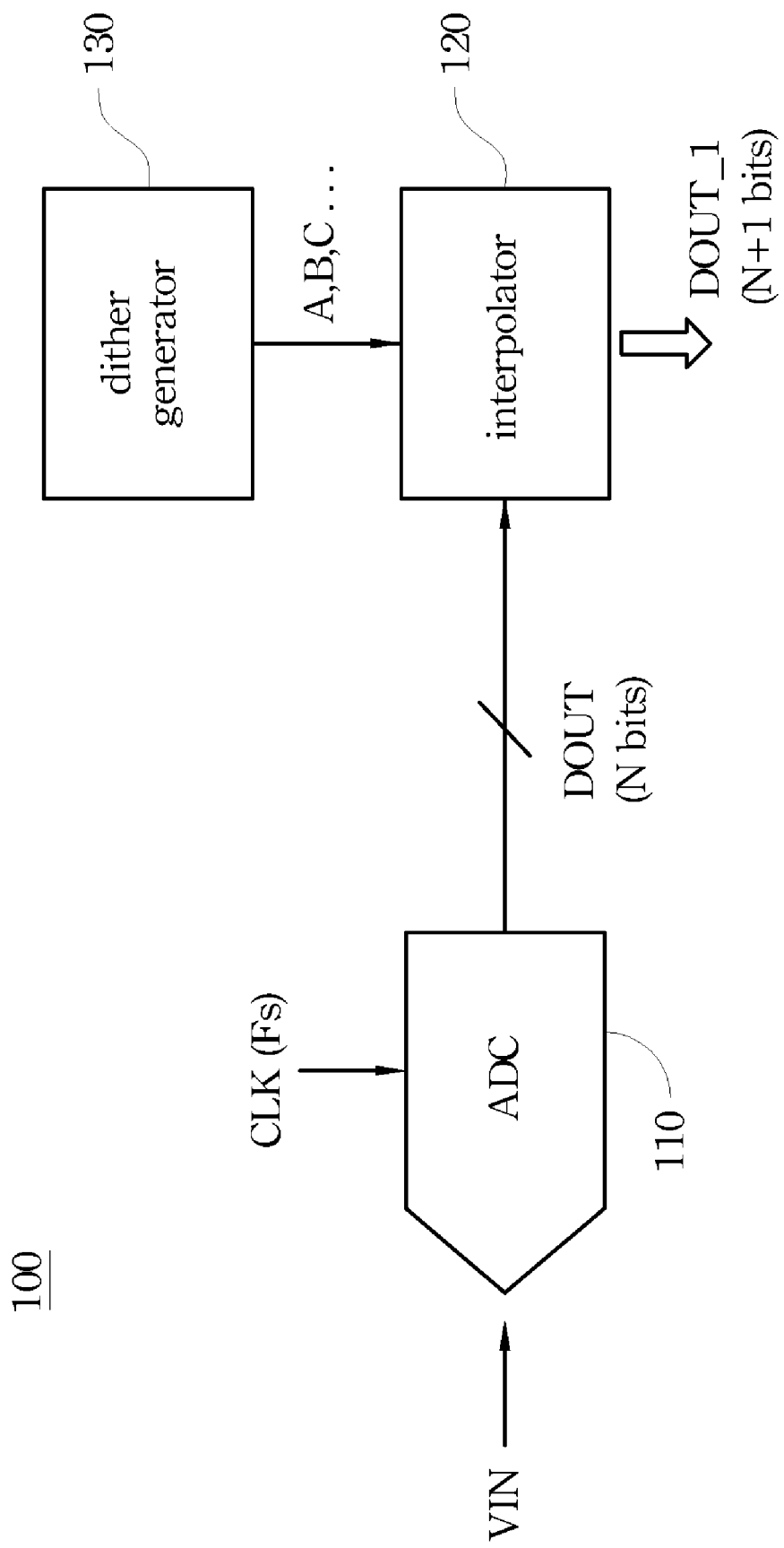
FIG. 1 illustrates a general block diagram of an A/D converter according to one embodiment of the present invention.

FIG. 1 illustrates a general block diagram of an A/D converter according to one embodiment of the present invention. The A/D converter 100 includes an A/D converting unit 110, an interpolator 120 and a dither generator 130. The A/D converting unit 110 converts an analog input signal VIN into digital outputs DOUT with N bits, where N is a positive integer. The interpolator 120 interpolates the N-bit digital outputs DOUT to add one or more least significant bit (LSB) orders for the N-bit digital outputs DOUT. The dither generator 130 generates one or more dither values (e.g. A, B, C, . . . ) corresponding to the LSB orders to be least significant bits and superimposed on the interpolation of the N-bit digital outputs DOUT, such that the digital outputs DOUT_1 with higher resolution are generated, in which the dither generator 130 can be a pseudo random number generator (PRNG). In one embodiment, the interpolator 120 interpolates the N-bit digital outputs DOUT such that a single LSB order is added for the N-bit digital outputs DOUT, and the dither generator 130 accordingly generates a single dither value corresponding to the LSB order, thus generating the digital outputs DOUT_1 with (N+1) bits.

Figure 2:
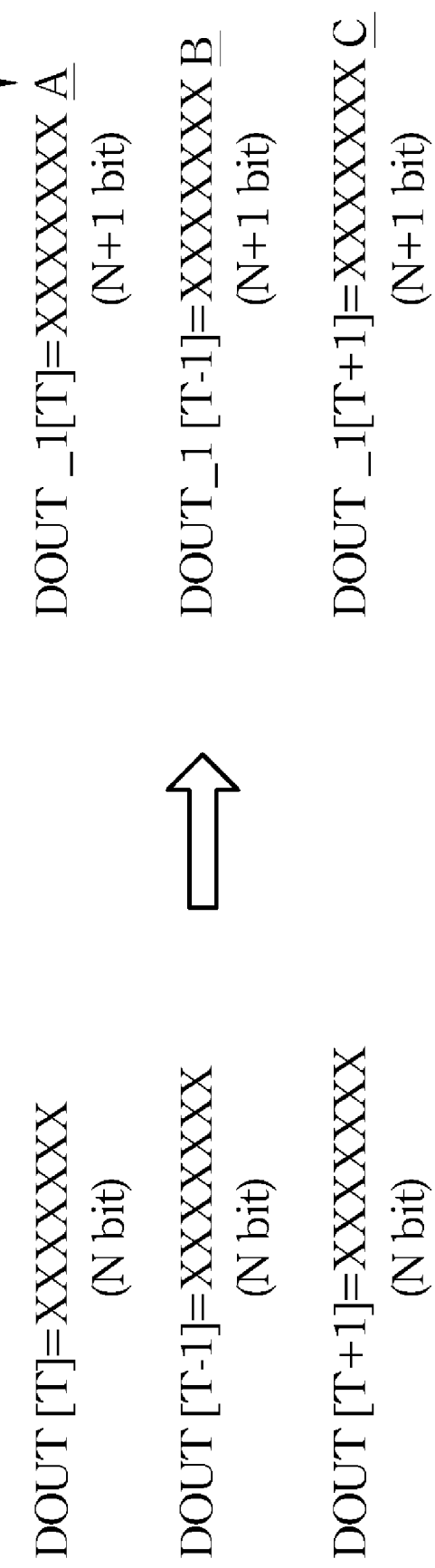
FIG. 2 illustrates a transformation example of the (N+1)-bit digital outputs.

FIG. 2 illustrates a transformation example of the (N+1)-bit digital outputs. As shown in FIG. 2, the N-bit digital output DOUT[T] is transformed into the (N+1)-bit digital output DOUT_1[T] with an additional LSB order and the LSB value of A, where A can randomly be 1 or 0; the N-bit digital output DOUT[T−1] is transformed into the (N+1)-bit digital output DOUT_1[T−1] with an additional LSB order and the LSB value of B, where B can randomly be 1 or 0; the N-bit digital output DOUT[T+1] is transformed into the (N+1)-bit digital output DOUT_1[T+1] with an additional LSB order and the LSB value of C, where C can randomly be 1 or 0. Similarly, other N-bit digital outputs can be transformed into corresponding (N+1)-bit digital outputs in the same manner.

Figure 3:
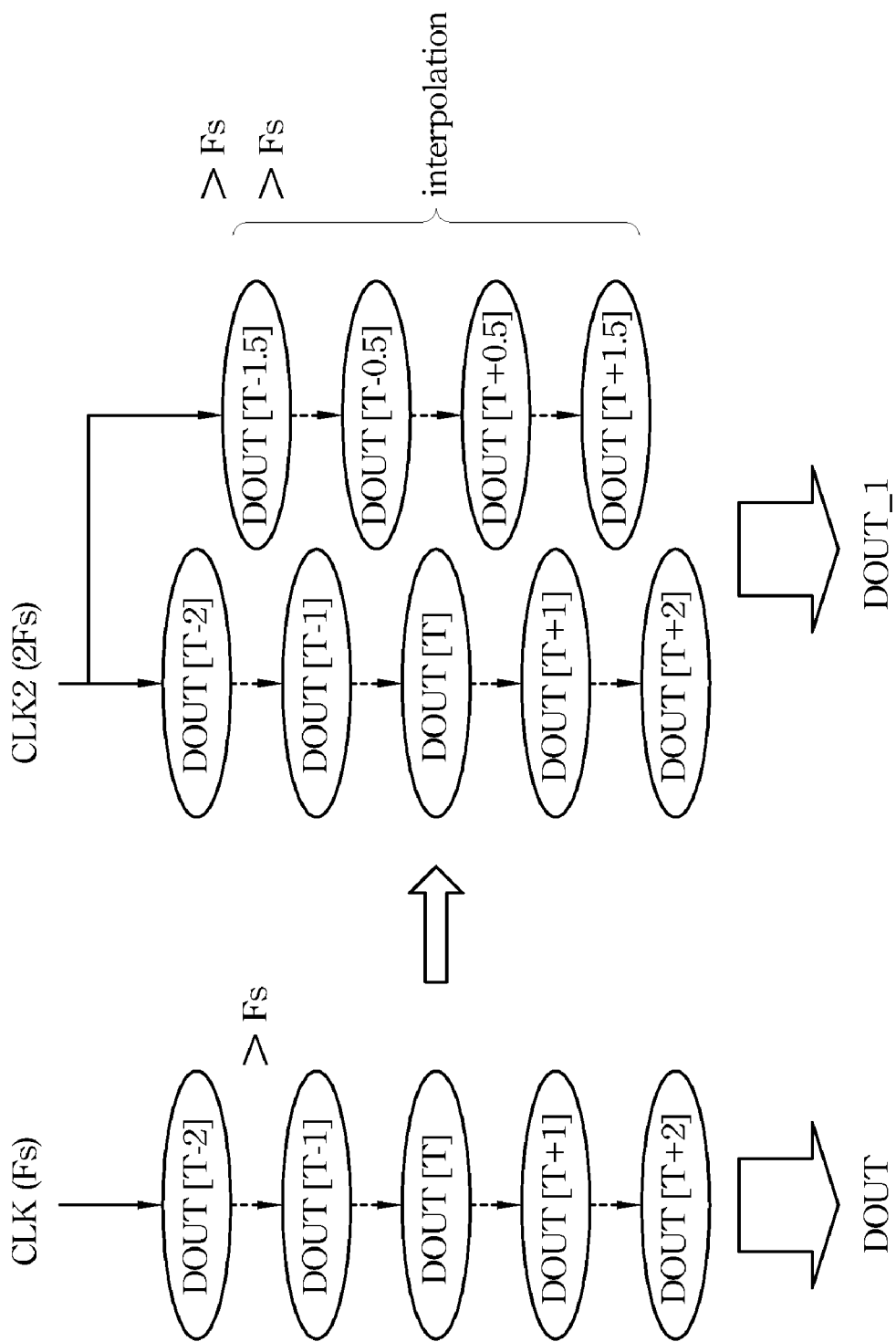
FIG. 3 illustrates a transformation example of the transmission frequency of the digital outputs after interpolation.

In one embodiment, the (N+1)-bit digital outputs DOUT_1 thus can have a transmission frequency two times that of the N-bit digital outputs DOUT. FIG. 3 illustrates a transformation example of the transmission frequency of the digital outputs after interpolation. As shown in FIG. 3, the N-bit digital outputs DOUT include DOUT[T−2], DOUT[T−1], DOUT[T], DOUT[T+1], DOUT[T+2], etc. and have a transmission frequency of Fs, in which two adjacent N-bit digital outputs have a time interval therebetween corresponding to the transmission frequency Fs. After the interpolation and the superimposition with the dither values, the N-bit digital outputs DOUT are transformed into the (N+1)-bit digital outputs DOUT_1 including DOUT[T−2], DOUT[T−1.5], DOUT[T−1], DOUT[T−0.5], DOUT[T], DOUT[T+0.5], DOUT[T+1], DOUT[T+1.5], DOUT[T+2], etc. and have a transmission frequency of 2Fs, in which DOUT[T−1.5], DOUT[T−0.5], DOUT[T+0.5], DOUT[T+1.5], etc. are interpolation signals and each has a value which is the average of two (N+1)-bit digital outputs adjacent thereto; for example, DOUT[T−0.5]= (DOUT[T]+DOUT[T−1])/2. In addition, two adjacent (N+1)-bit digital outputs have a time interval therebetween corresponding to the transmission frequency Fs; for example, DOUT[T−2] and DOUT[T−1.5] have the time interval therebetween corresponding to the transmission frequency Fs.

Figure 4:
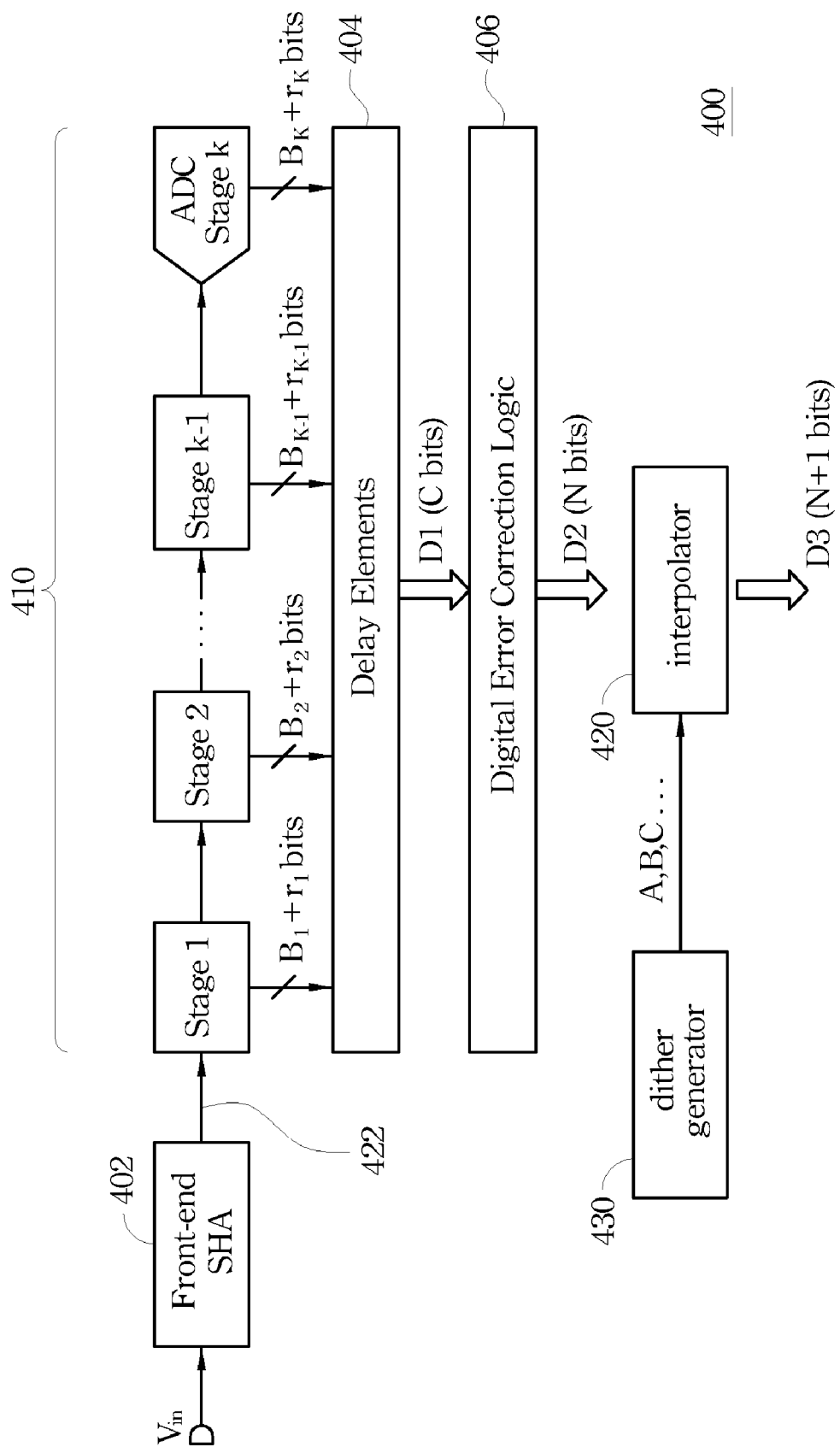
FIG. 4 illustrates a block diagram of a pipelined A/D converter according to one embodiment of the present invention.

FIG. 4 illustrates a block diagram of a pipelined A/D converter according to one embodiment of the present invention. The A/D converter 400 includes a front-end sample-and-hold amplifier (SHA) 402, a plurality of stages (e.g. K stages) of cascade-connected analog-to-digital converting (ADC) units 410, delay elements 404, a digital error correction logic 406, an interpolator 420 and a dither generator 430. The SHA 402 receives and samples the analog input signal Vin and holds the sampling signal 422 for the 1st stage of the ADC units 410. The ADC units 410 serially convert the sampling signal 422 into corresponding digital values. Specifically, each stage of the ADC units 410 generates the digital value having a resolution of Bi+ri bits, where Bi represents the effective stage resolution and ri represents the redundancy for an offset correction. Each stage digitizes the residue of the previous stage, so the digital value $B_1$ outputted from the 1st stage of the ADC units 410 contains the most significant bits (MSBs) while the digital value $B_K$ outputted from the Kth stage of the ADC units 410 contains the least significant bits (LSBs). In addition, the ADC units 410 operate concurrently; that is, the 1st stage operates on the most recent sample from the SHA 402 while all other stages operate on residues from previous samples.

The delay elements 404 synchronize the digital values from the ADC units 410 and generate digital outputs D1 with C bits. The digital error correction logic 406 corrects errors or offsets in the digital output D1 and thus generates digital outputs D2 with N bits. The interpolator 420 interpolates the N-bit digital outputs D2 to add one or more LSB orders for the N-bit digital outputs D2. The dither generator 430 generates one or more dither values (e.g. A, B, C, . . . ) corresponding to the LSB orders to be least significant bits and superimposed on the interpolation of the N-bit digital outputs D2, such that the digital outputs D3 with higher resolution are generated, in which the dither generator 430 can be a pseudo random number generator (PRNG).

In one embodiment (as shown in FIG. 2), the interpolator 420 interpolates the N-bit digital outputs D2 such that a single LSB order is added for the N-bit digital outputs D2 within each conversion cycle of the A/D converter 400, and the dither generator 430 accordingly generates a single dither value corresponding to the LSB order, thus generating the digital outputs D3 with (N+1) bits. Furthermore, the (N+1)-bit digital outputs D3 can thus have a transmission frequency two times that of the N-bit digital outputs D2 (as shown in FIG. 3) after the single dither value is superimposed on the interpolation of the N-bit digital outputs D2.

Figure 5:
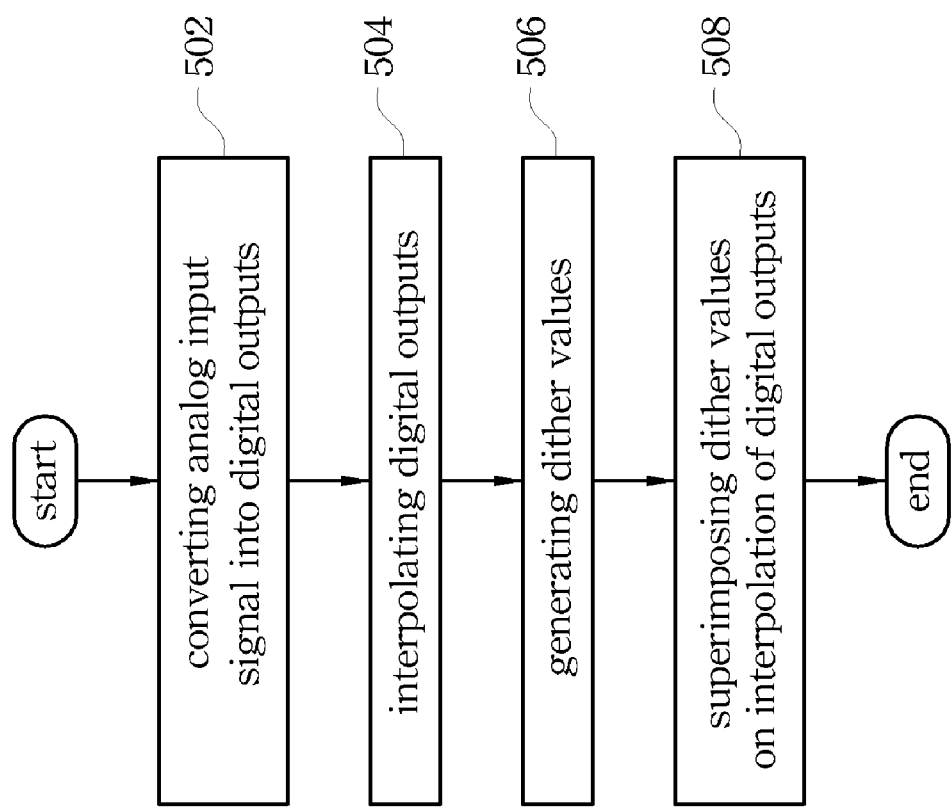
FIG. 5 illustrates a flow chart of a method for enhancing resolution of digital signals converted from analog signals according to one embodiment of the present invention.

FIG. 5 illustrates a flow chart of a method for enhancing resolution of digital signals converted from analog signals according to one embodiment of the present invention. First, the analog input signal is converted into N-bit digital outputs, where N is a positive integer (Step 502). Then, the N-bit digital outputs are interpolated to add one or more LSB orders for the N-bit digital outputs (Step 504). After that, one or more dither values are generated as LSBs corresponding to the LSB orders (Step 506). Afterwards, the dither values are superimposed on the interpolation of the N-bit digital outputs, thus generating new digital outputs with higher resolution (Step 508). In one embodiment, the N-bit digital outputs are interpolated such that a single LSB order is added for the N-bit digital outputs, and a single dither value corresponding to the LSB order is accordingly generated, thus generating the (N+1)-bit digital outputs. Moreover, the (N+1)-bit digital outputs, converted from the N-bit digital outputs, can thus have the transmission frequency two times that of the N-bit digital outputs.

Figure 6:
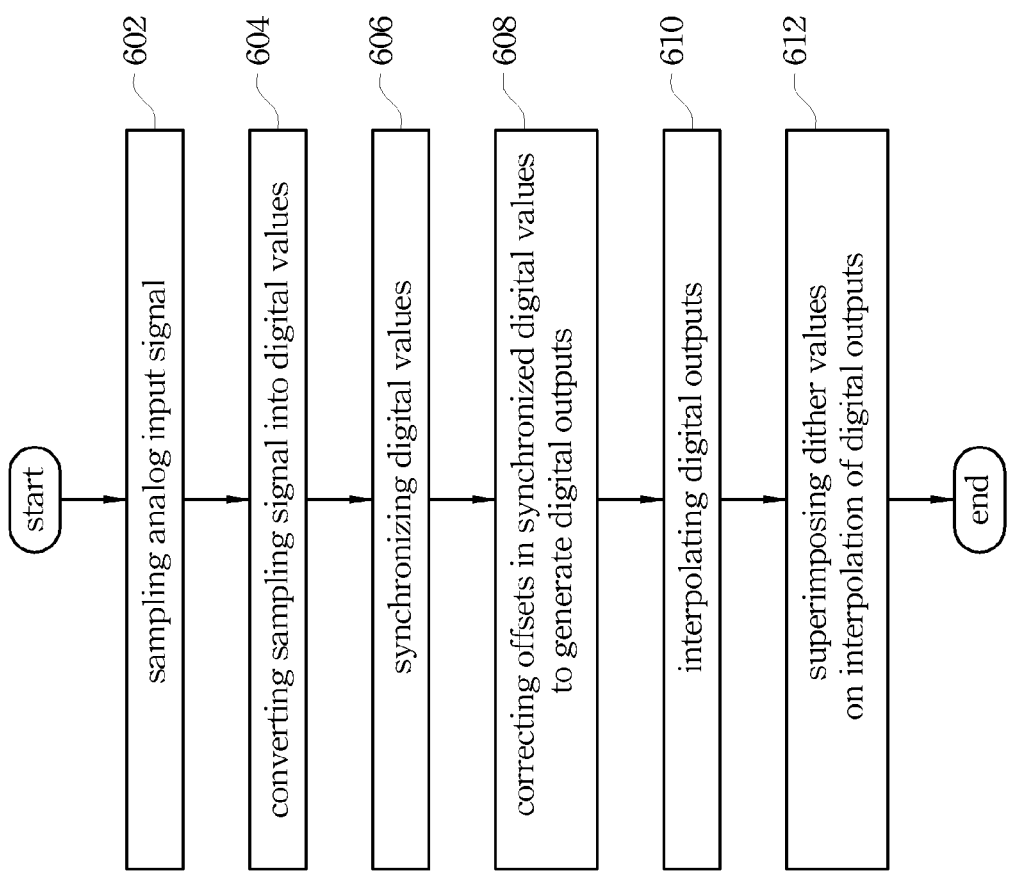
FIG. 6 illustrates a flow chart of a method for enhancing resolution of digital signals converted from analog signals according to another embodiment of the present invention.

FIG. 6 illustrates a flow chart of a method for enhancing resolution of digital signals converted from analog signals according to another embodiment of the present invention. Refer to FIGS. 4 and 6. First, the analog input signal Vin is sampled by the SHA 402 to obtain the sampling signal 422 (Step 602). Then, the sampling signal 422 is serially converted, by the ADC units 410, into corresponding digital values each having a resolution of Bi+ri bits (Step 604). After that, the digital values are synchronized by the delay elements 404 (Step 606). Later, offsets or errors in the synchronized digital values are corrected, by the digital error correction logic 406, to generate the N-bit digital outputs D2, each of which is represented by a plurality of bits (Step 608). Then, the N-bit digital outputs D2 are interpolated, by the interpolator 420, such that each of the N-bit digital outputs D2 has an additional bit order (Step 610). Afterwards, the dither values (A, B, C, . . . ), corresponding to the additional bit order and generated by the dither generator 430, are superimposed on the interpolation of the N-bit digital outputs D2, thus generating the (N+1)-bit digital outputs D3.

In one embodiment, a new digital output can be generated between two of the original digital outputs D2 after the interpolating and superimposing step. In another embodiment, a new digital output can be generated between each adjacent two of the original digital outputs D2 after the interpolating and superimposing step, and the bit value of the new digital output is an average of the adjacent two of the original digital outputs D2. For example, as shown in FIG. 3, DOUT[T−1.5] is generated between two adjacent original digital outputs DOUT[T−2] and DOUT[T−1], and the bit value of DOUT[T−1.5] is the average of DOUT[T−2] and DOUT[T−1].

In addition, the transmission frequency of the new digital outputs together with the original digital outputs D2 can be two times that of the original digital outputs D2. For example, as shown in FIG. 3, the transmission frequency of DOUT[T−1.5], DOUT[T−0.5], DOUT[T+0.5], DOUT[T+1.5], etc. together with DOUT[T−2], DOUT[T−1], DOUT[T], DOUT[T+1], DOUT[T+2], etc. is two times that of DOUT[T−2], DOUT[T−1], DOUT[T], DOUT[T+1], DOUT[T+2], etc.

For the foregoing embodiments, the A/D converter and the method for enhancing resolution of digital signals can be employed to enhance the resolution of the digital signals outputted from the A/D converter such that the digital signals can be well converted from the analog input signal inputted into the A/D converter.

As is understood by a person skilled in the art, the foregoing embodiments of the present invention are illustrative of the present invention rather than limiting of the present invention. It is intended to cover various modifications and similar arrangements included within the spirit and scope of the appended claims, the scope of which should be accorded the broadest interpretation so as to encompass all such modifications and similar structures.

What is claimed is:

1. An analog-to-digital converter, comprising:
   a plurality of stages of analog-to-digital converting (ADC) units for serially converting an analog input signal into corresponding digital values;
   delay elements for synchronizing the digital values from the ADC units;
   a digital logic correction circuit for correcting offsets in the digital values from the delay elements to generate N-bit digital outputs, where N is a positive integer;
   an interpolator for interpolating the N-bit digital outputs to add one or more least significant bit orders for the N-bit digital outputs; and
   a dither generator for generating one or more dither values corresponding to the least significant bit orders to be least significant bits and superimposed on the interpolation of the N-bit digital outputs.

2. The analog-to-digital converter as claimed in claim 1, wherein the interpolator interpolates the N-bit digital outputs to add a single least significant bit order for the N-bit digital outputs within each conversion cycle of the analog-to-digital converter.

3. The analog-to-digital converter as claimed in claim 2, wherein the dither generator generates a single dither value corresponding to the single least significant bit order.

4. The analog-to-digital converter as claimed in claim 3, wherein the N-bit digital outputs are converted into (N+1)-bit digital outputs having a transmission frequency two times that of the N-bit digital outputs.

5. The analog-to-digital converter as claimed in claim 1, wherein the interpolator and the dither generator convert the N-bit digital outputs into (N+1)-bit digital outputs having a transmission frequency two times that of the N-bit digital signals.

6. The analog-to-digital converter as claimed in claim 1, wherein the dither generator is a random number generator.

7. A method for enhancing resolution of digital signals converted from analog signals, comprising:
   converting an analog input signal into N-bit digital outputs, where N is a positive integer;
   interpolating the N-bit digital outputs to add one or more least significant bit orders for the N-bit digital outputs;
   generating one or more dither values as least significant bits corresponding to the least significant bit orders; and
   superimposing the dither values on the interpolation of the N-bit digital outputs.

8. The method as claimed in claim 7, wherein the N-bit digital outputs are interpolated to add a single least significant bit order.

9. The method as claimed in claim 8, wherein a single dither value corresponding to the single least significant bit order is generated.

10. The method as claimed in claim 9, wherein the N-bit digital outputs are converted into (N+1)-bit digital outputs having a transmission frequency two times that of the N-bit digital outputs.

11. The method as claimed in claim 7, wherein the N-bit digital outputs are converted into (N+1)-bit digital outputs.

12. A method for enhancing resolution of digital signals converted from analog signals, comprising:
   sampling an analog input signal to obtain a sampling signal;
   converting the sampling signal into corresponding digital values;
   synchronizing the digital values;
   correcting offsets in the synchronized digital values to generate a plurality of digital outputs each represented by a plurality of bits;
   interpolating the digital outputs such that each of the digital outputs has an additional bit order; and
   superimposing dither values corresponding to the additional bit order on the interpolation of the digital outputs.

13. The method as claimed in claim 12, further comprising generating an (N+1)-bit digital output between two of the digital outputs with N bits after the interpolating and superimposing step.

14. The method as claimed in claim 12, further comprising generating an (N+1)-bit digital output between each adjacent two of the digital outputs with N bits after the interpolating and superimposing step.

15. The method as claimed in claim 14, wherein a transmission frequency of the (N+1)-bit digital outputs together with the N-bit digital outputs is two times that of the N-bit digital outputs.

16. The method as claimed in claim 14, wherein a bit value of the (N+1)-bit digital output is an average of the adjacent two of the N-bit digital outputs.

* * * * *